(12) United States Patent
Liao et al.

(10) Patent No.: US 11,315,513 B2
(45) Date of Patent: Apr. 26, 2022

(54) DRIVING CIRCUIT FOR DISPLAY PANEL AND HIGH VOLTAGE TOLERANT CIRCUIT

(71) Applicant: SITRONIX TECHNOLOGY CORP., Jhubei (TW)

(72) Inventors: Kuan-Chao Liao, Jhubei (TW); Sheng-Yu Lin, Jhubei (TW)

(73) Assignee: Sitronix Technology Corp., Jhubei (TW)

( * ) Notice: Subject to any disclaimer, the term of this patent is extended or adjusted under 35 U.S.C. 154(b) by 0 days.

(21) Appl. No.: 16/227,619

(22) Filed: Dec. 20, 2018

(65) Prior Publication Data

US 2020/0258465 A1 Aug. 13, 2020

Related U.S. Application Data

(60) Provisional application No. 62/607,979, filed on Dec. 20, 2017.

(51) Int. Cl.
*G09G 5/00* (2006.01)
*G09G 3/36* (2006.01)
*H03K 17/687* (2006.01)

(52) U.S. Cl.
CPC ....... *G09G 3/3677* (2013.01); *H03K 17/6871* (2013.01); *G09G 3/3696* (2013.01); (Continued)

(58) Field of Classification Search
CPC . G09G 3/3677; G09G 3/3696; H03K 17/6871
See application file for complete search history.

(56) References Cited

U.S. PATENT DOCUMENTS

2001/0033266 A1* 10/2001 Lee .................. G09G 3/3677
345/94
2005/0248550 A1* 11/2005 Kobayashi .......... G09G 3/3696
345/204

(Continued)

FOREIGN PATENT DOCUMENTS

CN       1873751 A      12/2006
TW    201120847 A1     6/2011
(Continued)

OTHER PUBLICATIONS

International Search Report Issued By a Foreign Patent Office, dated Dec. 31, 2019.

*Primary Examiner* — Adam J Snyder
(74) *Attorney, Agent, or Firm* — Rosenberg, Klein & Lee

(57) ABSTRACT

A driving circuit for display panel is provided. Wherein, a first and a second power supply circuits produce a first and a second supply voltages. The electric charge provided by the second power supply circuit is less than that provided by the first power supply circuit. A plurality of drivers include a plurality of first power input terminals and a plurality of second power input terminals. The first power input terminals are coupled to the first power supply circuit and receives the first supply voltage. The second power input terminals are coupled to the second power supply circuit and receives the second supply voltage. The drivers increase the voltage levels of a plurality of gate signals in a voltage rising period according to the first supply voltage. The drivers hold the voltage levels of gate signals in a voltage holding period according to the second supply voltage.

21 Claims, 6 Drawing Sheets

(52) U.S. Cl.
CPC ............... *G09G 2310/0243* (2013.01); *G09G 2330/021* (2013.01)

(56) References Cited

U.S. PATENT DOCUMENTS

| | | | | |
|---|---|---|---|---|
| 2007/0040825 A1* | 2/2007 | Mamba | ................ | G09G 3/3614 345/211 |
| 2008/0303764 A1* | 12/2008 | Hyun | ................... | G09G 3/3696 345/87 |
| 2011/0141086 A1* | 6/2011 | Huang | ................... | G09G 3/344 345/211 |
| 2012/0038610 A1* | 2/2012 | Li | ........................ | G09G 3/3696 345/211 |
| 2012/0188213 A1* | 7/2012 | Nam | ................... | G09G 3/3614 345/208 |
| 2013/0314392 A1* | 11/2013 | Kim | .................... | G09G 3/3677 345/212 |
| 2014/0062985 A1* | 3/2014 | Shin | .................... | G09G 3/3696 345/212 |
| 2015/0280700 A1* | 10/2015 | Lai | ....................... | G09G 3/3648 345/215 |
| 2020/0234670 A1* | 7/2020 | Horibe | ................ | G09G 3/3696 |

FOREIGN PATENT DOCUMENTS

| | | |
|---|---|---|
| TW | 201122507 A1 | 7/2011 |
| TW | 201419250 A | 5/2014 |

\* cited by examiner

DRIVING CIRCUIT FOR DISPLAY PANEL AND HIGH VOLTAGE TOLERANT CIRCUIT

FIELD OF THE INVENTION

The present invention relates to a driving circuit, and particularly to a driving circuit for display panel and a high voltage tolerant circuit.

BACKGROUND OF THE INVENTION

The trend of the development of liquid crystal display technology is high resolution and large size. Liquid crystal displays own the advantages of lightness, long lifetime, and high resolution and hence are applied extensively to various electronic devices such as handheld electronic devices, domestic TV, and various outdoor large screens.

Currently, to optimize liquid crystal displays, the amorphous silicon gate (ASG) technology has been developed. The technology is also called the gate on panel (GOP), the gate on array (GOA), or the gate in panel (GIP) technology. Namely, while manufacturing the thin-film-transistor array of a display panel, the circuit for driving gate lines is formed on the substrate of the display panel. The circuit on the substrate will receive a gate signal generated by the gate driving circuit and thus generating a plurality of gate driving signals according to the gate signal for driving the pixels coupled to the gate lines. Thereby, the pins for coupling the gate driving circuit and the display panel can be reduced.

According to the prior art, a single power supply is used as the power source for the gate driving circuit. In addition, a portion of the time at which the gate driving circuit generates a plurality of gate signals overlap. For example, at the same instant, the voltage level of the first gate signal is at a turn-on voltage level while the voltage of the second gate signal is still rising. Thereby, given a single power supply is adopted for the gate driving circuit to generate the plurality of gate signals, the first gate signal with a turn-on voltage level will be influenced by the second gate signal with a rising voltage level. The reason is that the second gate signal will pull down the voltage level of the power supply and the voltage level of the first gate signal is maintained at the turn-on voltage level according to the power supply. Consequently, the voltage level of the first gate signal will be affected. The Taiwan Patent No. TW I546797 B provides a method for solve the problem. Unfortunately, the solution cannot meet the high standard for liquid crystal displays.

Accordingly, the present invention provides a driving circuit for display panel for solving the above problem.

SUMMARY

An objective of the present invention is to provide a driving circuit for display panel, which uses power circuits with different driving capabilities for controlling the voltage levels of the gate signals not mutually interference.

The present invention discloses a driving circuit for display panel, which comprises a first power supply circuit, a second power supply circuit, and a plurality of drivers. The first power supply circuit produces a first supply voltage; the second power supply circuit produces a second supply voltage. The electric charge provided by the second power supply circuit is less than the electric charge provided by the first power supply circuit. The plurality of drivers generates a plurality of gate signals and includes a plurality of first power inputs and a plurality of second power inputs. The plurality of first power inputs are coupled to the first power supply circuit and receives the first supply voltage. The plurality of second power inputs are coupled to the second power supply circuit and receives the second supply voltage. The plurality of drivers increase the voltage levels of the plurality of gate signals, respectively, in a voltage rising period according to the first supply voltage. The plurality of drivers hold the voltage levels of the plurality of gate signals, respectively, in a voltage holding period according to the second supply voltage.

In addition, the present invention discloses a high voltage tolerant circuit of driving circuit, which comprises a first switching device, a second switching device, and a control device. The first switching device receives and transmits an input voltage. The second switching device is coupled between the first switching device and an output terminal and transmits the input voltage to the output terminal. A body of the second switching device is coupled to a body of the first switching device. The control device is coupled to a body contact of the first and second switching devices and to a control voltage. The control device controls a voltage level of the body contact of the first and second switching devices according to the control voltage.

DETAILED DESCRIPTION

In the specifications and subsequent claims, certain words are used for representing specific devices. A person having ordinary skill in the art should know that hardware manufacturers might use different nouns to call the same device. In the specifications and subsequent claims, the differences in names are not used for distinguishing devices. Instead, the differences in whole technique are the guidelines for distinguishing. In the whole specifications and subsequent claims, the word "comprising" is an open language and should be explained as "comprising but not limited to". Besides, the word "couple" includes any direct and indirect electrical connection. Thereby, if the description is that a first device is coupled to a second device, it means that the first device is connected electrically to the second device directly, or the first device is connected electrically to the second device via other device or connecting means indirectly.

In order to make the structure and characteristics as well as the effectiveness of the present invention to be further understood and recognized, the detailed description of the present invention is provided as follows along with embodiments and accompanying figures.

Figure 1:
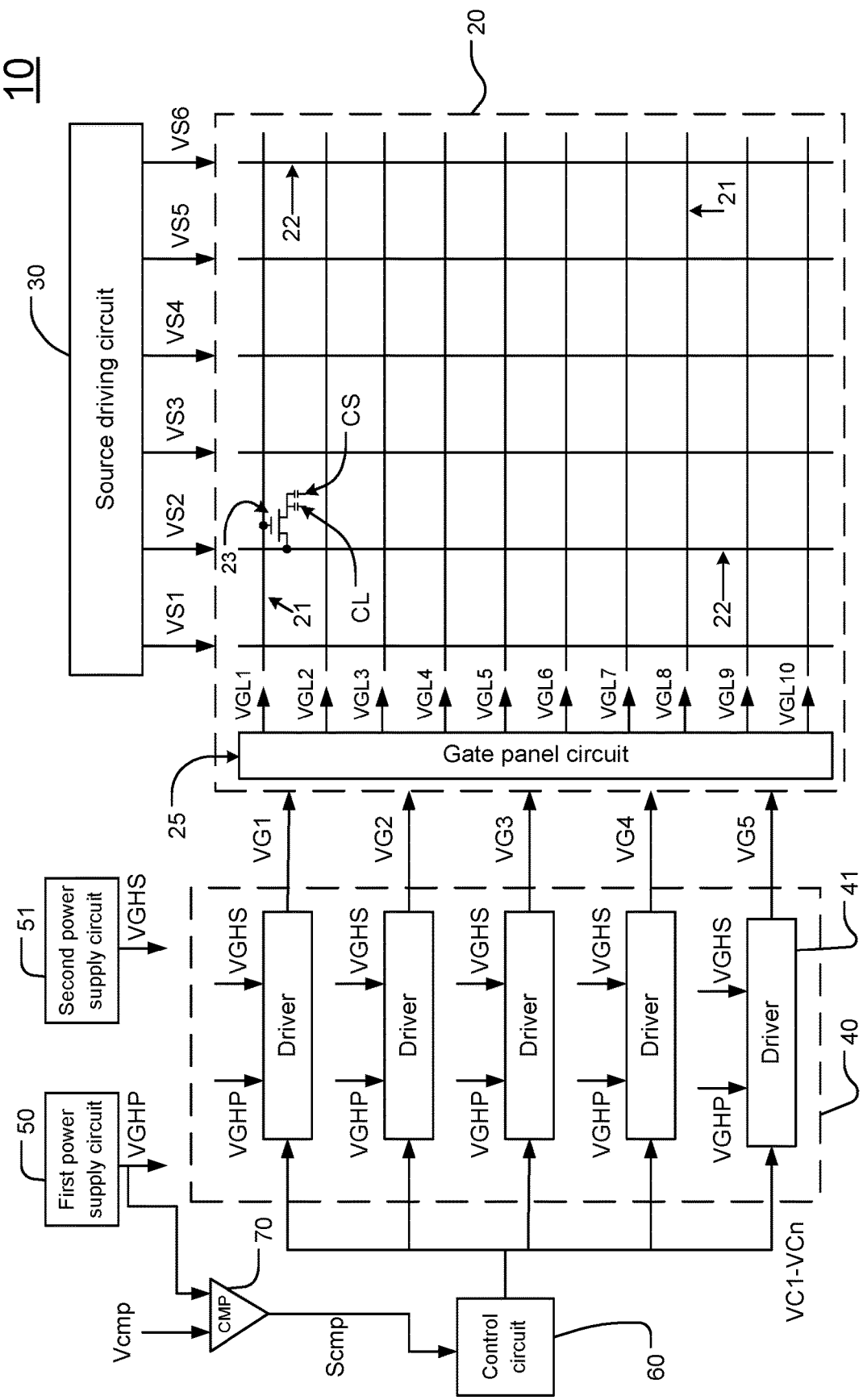
FIG. 1 shows a schematic diagram of the driving circuit for the display panel of a display according to an embodiment of the present invention.

Please refer to FIG. 1, which shows a schematic diagram of the driving circuit for the display panel of a display according to an embodiment of the present invention. As shown in the figure, a display 10 includes a display panel 20 and a driving circuit for display panel. The display panel 20 includes a plurality of pixels, a plurality of gate lines 21, and a plurality of source lines 22. Each pixel includes a pixel transistor 23, a liquid crystal capacitance CL, and a storage capacitance CS. The pixel transistor 23 is coupled to the liquid crystal capacitance CL and the storage capacitance CS. A gate panel circuit 25 is formed on the display panel 20 and coupled to the plurality of gate lines 21, and thus coupled to a gate terminal of the plurality of pixel transistors 23. In addition, the gate panel circuit 25 receives a plurality of gate signals VG1, VG2, VG3, VG4, VG5. Thereby, the gate panel circuit 25 generates a plurality of gate line driving signals according to the plurality of gate signals VG1-VG5 and transmits them to the plurality of gate lines 21, respectively, for controlling the gate terminals of the plurality of pixel transistors 23 as well as the turning on and off of the gate terminals of the plurality of pixel transistors 23. The plurality of source lines 22 are coupled to a source terminal of the plurality of pixel transistors 23 and transmit a plurality of source signals VS1, VS2, VS3, VS4, VS5, VS6 to the source terminals of the plurality of pixel transistors 23 for charging the liquid crystal capacitance CL and the storage capacitance CS. A storage voltage of the storage capacitance CS is used for stabilizing the voltage level of the liquid crystal voltage of the liquid crystal capacitance CL.

The driving circuit for display panel comprises a source driving circuit 30 and a gate driving circuit 40. The source driving circuit 30 is coupled to the display panel 20 and generates the plurality of source signals VS1-VS6 to the plurality of source lines of the display panel 20 for reaching the plurality of pixel transistors 23. The gate driving circuit 40 is coupled to the display panel 20 and generates the plurality of gate signals VG1-VG5 to the gate panel circuit 25 of the display panel 20. Thereby, the driving circuit for display panel drives the display panel 20 to display a plurality of images.

Please refer again to FIG. 1. The driving circuit for display panel comprises a first power supply circuit 50 and a second power supply circuit 51. The first power supply circuit 50 produces a first supply voltage VGHP according to a first input power supply; the second power supply circuit 51 produces a second supply voltage VGHS according to a second input power supply. Alternatively, the second power supply circuit 51 can produce the second supply voltage VGHS according to the first input power supply, not limited to the embodiment of FIG. 1. The first power supply circuit 50 and the second power supply circuit 51 are coupled to the gate driving circuit 40 and output the first supply voltage VGHP and the second supply voltage VGHS to the gate driving circuit 40, respectively. The gate driving circuit 40 outputs the plurality of gate signals VG1-VG5 to the display panel 20 according to the first supply voltage VGHP and the second supply voltage VGHS.

The driving circuit for display panel comprises a control circuit 60 and a comparator 70. Both input terminals of the comparator 70 receive a baseline voltage Vcmp and the first supply voltage VGHP of the first power supply circuit 50, respectively. The comparator 70 can couple to the first power supply circuit 50 through a divide circuit. Thereby, the comparator 70 generates a compare signal Scmp according to the baseline voltage Vcmp and the first supply voltage VGHP. The compare signal Scmp can indicate if the voltage level of the first supply voltage exceed a predetermined voltage level, which is a multiple of the voltage level of the baseline voltage Vcmp. The control circuit 60 can be a timing controller and coupled to the comparator 70 and the gate driving circuit 40. It receives the compare signal Scmp and generates and transmits the plurality of control signals VC1-VCn to the gate driving circuit 40 according to the compare signal Scmp. Accordingly, the control circuit 60 controls the gate driving circuit 40 to generate the plurality of gate signals VG1-VG5 according to the compare signal Scmp.

According to the embodiment of FIG. 1, the electric charge output by the first power supply circuit 50 is greater than the electric charge output by the second power supply circuit 51. Namely, the output current of the first power supply circuit 50 is higher than the output current of the second power supply circuit 51. Thereby, the power-supply driving capability of the first power supply circuit 50 is greater than the power-supply driving capability of the second power supply circuit 51. Then the gate driving circuit 40 generates the plurality of gate signals VG1-VG5 according multiple sets of power supply circuits 50, 51 with different power-supply driving capabilities. The power supply circuits 50, 51 can be charge pump power supply circuit. In addition, whether the gate driving circuit 40 generates the plurality of gate signals VG1-VG2 according to the first supply voltage VGHP with a high power-supply driving capability or the second supply voltage VGHS with a low power-supply driving capability is determined by the control circuit 60. In other words, according to the compare signal Scmp generated by the comparator 70, the control circuit 60 controls the gate driving circuit 40 to rise or hold the voltage levels of the plurality of gate signals according to the first supply voltage VGHP or the second supply voltage VGHS provided by the power supply circuits 50, 51 with different power-supply driving capability at different times.

Figure 2:
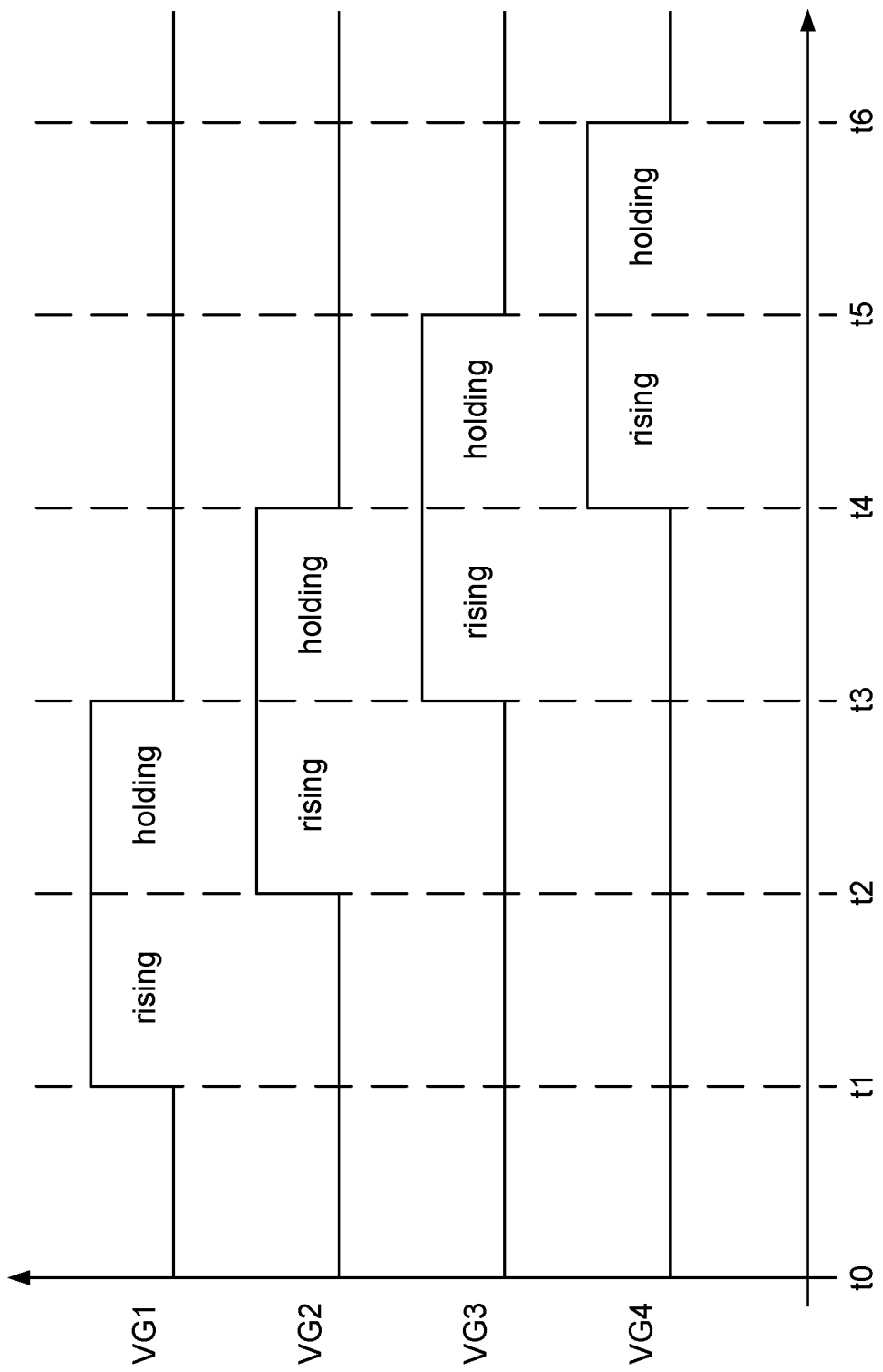
FIG. 2 shows a timing diagram of gate signals generated by the gate driving circuit with multiple power supply circuits at different times according to an embodiment of the present invention.

Please refer to FIG. 2, which shows a timing diagram of gate signals generated by the gate driving circuit with multiple power supply circuits at different times according to an embodiment of the present invention. As shown in the figure, the variation in the voltage levels of the plurality of gate signals VG1-VG5 includes a voltage rising period rising and a voltage holding period holding. In the voltage rising period rising, the voltage levels of the plurality of gate signals VG1-VG5 rise from a cutoff voltage level to a predetermined voltage level. In the voltage holding period, the voltage levels of the plurality of gate signals VG1-VG5 are maintained at a turn-on voltage level. According to the embodiments, the cutoff voltage is the voltage level to cut off the pixel transistors 23; the turn-on voltage level is the voltage level to turn on the pixel transistors 23; and the predetermined voltage level is the voltage rising target of the plurality of gate signals VG1-VG5 in the voltage rising period rising. According to the embodiments, the voltage rising target is the voltage level of the first supply voltage VGHP. The embodiments do not limit the voltage values of the cutoff voltage level, the turn-on voltage level, and the predetermined voltage level. They can be determined according to the power-supply driving capabilities of various power supply circuits and the display quality of the display panel 20.

The gate driving circuit 40 rises the voltage levels of the plurality of gate signals VG1-VG5 according to the first supply voltage VGHP in the voltage rising period rising, and holds the voltage levels of the plurality of gate signals VG1-VG5 according to the second supply voltage VGHS in the voltage holding period holding. According to the present embodiment, the voltage rising periods rising of the plurality of gate signals do not mutually overlap; the voltage holding periods holding of the plurality of gate signals do not mutually overlap, either. Thereby, the gate driving circuit 40 rises the voltage levels of the plurality of gate signals VG1-VG5 according to the first supply voltage VGHP in different times, respectively, and holds the voltage levels of the plurality of gate signals VG1-VG5 according to the second supply voltage VGHS in different times, respectively. Besides, according to another embodiment of the present invention, the voltage rising periods rising of the plurality of gate signals can mutually overlap; the voltage holding periods holding of the plurality of gate signals can mutually overlap, too. When the voltage levels of the plurality of gate signals VG1-VG5 are risen by the first supply voltage VGHP to the predetermined voltage level, the second supply voltage VGHS holds the voltage levels of the plurality of gate signals VG1-VG5 at the turn-on voltage level. Thereby, as the voltage level of another gate signal is been rising by the first supply voltage VGHP, the gate signals at the turn-on voltage level will not affected.

In other words, the driving circuit for display panel uses the first power supply circuit 50 with a larger power-supply driving capability and the second power supply circuit 51 with a limited power-supply driving capability to control the voltage levels of the gate lines 21 for achieving a high-efficiency driving circuit. The first power supply circuit 50 with a larger power-supply driving capability is the power supply circuit capable of rising the voltage level rapidly. Contrarily, the second power supply circuit 51 with a limited power-supply driving capability refers to the power supply circuit with an inferior capability in rising voltage levels and in rising rate.

Figure 3:
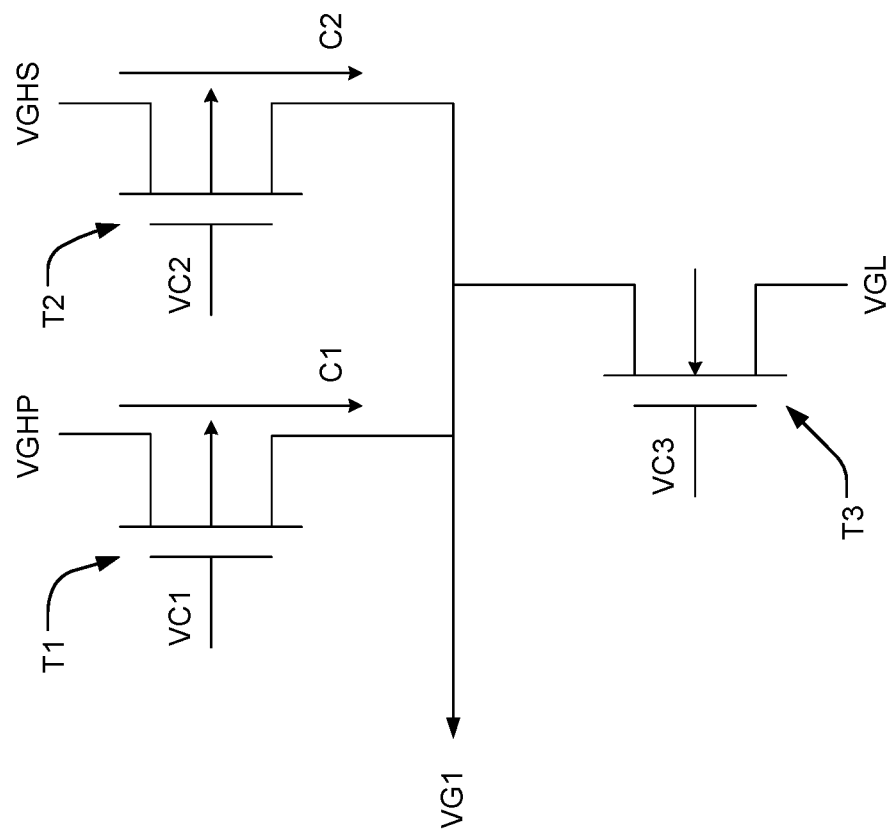
FIG. 3 shows a circuit diagram of the driver according to a first embodiment of the present invention.

Please refer to FIG. 3, which shows a circuit diagram of the driver according to a first embodiment of the present invention. As shown in the figure, the driver 41 includes a plurality of transistors T1, T2, T3. An input terminal of the transistor T1 is coupled to the first power supply circuit 50 and receives the first supply voltage VGHP. The input terminal of the transistor T1 is a first power supply input terminal of the driver 41. A control terminal of the transistor T1 is coupled to the control circuit 60 for receiving the control signal VC1. An output terminal of the transistor T1 is coupled to an output terminal of the driver 41. After the control circuit 60 outputs the control signal VC1 and controls the transistor T1 to turn on, the transistor T1 transmits the first supply voltage VGHP to the output terminal of the driver 41 for rising the voltage level of the gate signal VG1 to the voltage level of the first supply voltage VGHP in the voltage rising period rising. The input and output terminals of the transistors in the embodiment can be the source or the drain of the transistors. The control terminal of the transistors can be the gate of the transistors.

An input terminal of the transistor T2 is coupled to the second power supply circuit 51 and receives the second supply voltage VGHS. The input terminal of the transistor T2 is a second power supply input terminal of the driver 41. A control of the transistor T2 is coupled to the control circuit 60 and receives a control signal VC2. An output terminal of the transistor T2 is coupled to the output terminal of the driver 41. After the control circuit 60 outputs the control signal VC2 and controls the transistor T2 to turn on, the transistor T2 transmits the second supply voltage VGHS to the output terminal of the driver 41 for maintaining the voltage level of the gate signal VG1 at the voltage of the second supply voltage, namely, the turn-on voltage level, in the voltage holding period holding. Thereby, the gate signal VG1 can control the conduction condition of the transistor 23. In addition, according to the embodiment of FIG. 3, the voltage level of the second supply voltage VGHS is lower than the voltage of the first supply voltage VGHP. According to another embodiment of the present invention, the voltage level of the second supply voltage VGHS can be equal or approximate to the voltage of the first supply voltage VGHP.

Furthermore, as the gate signal VG1 is held at the turn-on voltage level, the first power supply circuit 50 does not supply power to the gate signal VG1. Consequently, the first power supply circuit 50 supplies the first supply voltage VGHP to the gate signal VG2 of the next gate line 21 for rising the voltage level of the gate signal VG2. Thereby, the power of the gate signal VG1 and the gate signal VG2 are supplied by different power supply circuits 50, 51, respectively. The turn-on voltage level of the gate signal VG1 is not influenced by the turn-on of the next gate line 21. In other words, the gate signal VG1 can be held at the turn-on voltage level instead of being pulled down by the gate signal VG2.

Please refer again to FIG. 3. An output terminal of the transistor T3 is coupled to the output terminals of the transistors T1, T2, and the driver 41. A control terminal of the transistor T3 is coupled to the control circuit 60 and receives a control signal VC3. An input terminal of the transistor T3 is coupled to a third supply voltage VGL, which can be a cutoff voltage of the pixel transistor 23. After the control circuit 60 outputs the control signal VC3 and controls the transistor T3 to turn on, the transistor T3 transmits the third supply voltage VGL to the output terminal of the driver 41 for pulling down the voltage level of the gate signal VG1 to the voltage level of the third supply voltage VGL. In other words, the gate signal VG1 is changed to the cutoff voltage level and thud cutting off the pixel transistor 23.

In addition, the electric charge C1 (or current) output by the first power supply circuit 50 is greater than the electric charge C2 (or current) output by the second power supply circuit 51. Namely, the power-supply driving capability of the first power supply circuit 50 is higher than the power-supply driving capability of the second power supply circuit 51. Thereby, the current transported by the transistor T1 is higher than the current transported by the transistor T2.

Figure 4:
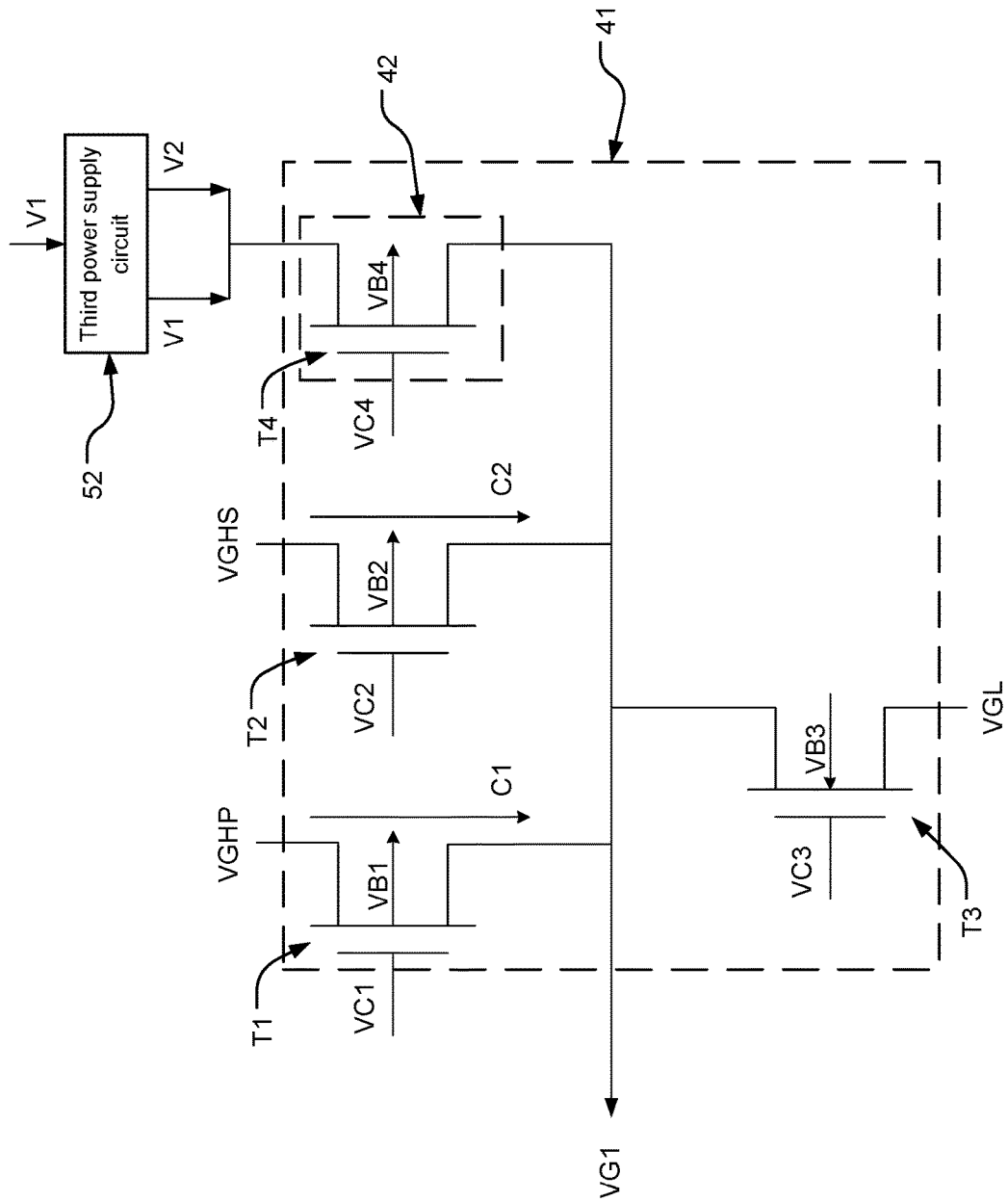
FIG. 4 shows a circuit diagram of the driver according to a second embodiment of the present invention.

Please refer to FIG. 4, which shows a circuit diagram of the driver according to a second embodiment of the present invention. As shown in the figure, to save the power consumption of the gate signal VG1 in the voltage rising period rising, the driver 41 can include a precharge circuit 42, which includes a high voltage device such as a high voltage tolerant transistor T4. The precharge circuit 42 is coupled to the output terminal of the driver 41 for outputting a precharge voltage to the output terminal of the driver 41. Thereby, the gate signal VG1 can be precharged to the voltage level of the precharge voltage before being charged to the voltage level of the first supply voltage VGHP. The embodiment in FIG. 4 includes a third power supply circuit 52, which is capable of outputting precharge voltages with different levels, namely, a first precharge voltage V1 and a second precharge voltage V2 in the embodiment in FIG. 4. The third power supply circuit 52 receives and outputs the first precharge voltage V1 without rising its voltage level. Alternatively, the third power supply circuit 52 receives the first precharge voltage V1, rises its voltage level, and outputs the second precharge voltage V2. Thereby, a second precharge voltage level of the second precharge voltage V2 is higher than a first precharge voltage level of the first precharge voltage V1. Besides, the third power supply circuit 52 can include a switching device or a switching circuit for outputting the first precharge voltage V1 or the second precharge voltage V2 to the precharge circuit 42.

Moreover, the first precharge voltage V1 can be an external power supply voltage VDD produced by an external power supply circuit. The external power supply voltage VDD can be output directly to the precharge circuit, instead of by way of the third power supply circuit 52. In other words, the first precharge voltage V1 and the second precharge voltage V2 can be produced by different external power supply circuits. In addition, the bodies (or named the base) of the transistors T1-T4 are biased by body voltages (or named base biases) VB1, VB2, VB3, VB4, respectively. According to another embodiment of the present invention the precharge circuit 42 can be coupled to the first power supply circuit 50, which can provide the first precharge voltage V1 and the second precharge voltage V2. The first power supply circuit 50 can include the switching circuit for providing the first precharge voltage V1, the second precharge voltage V2, and the first supply voltage VGHP.

Figure 5:
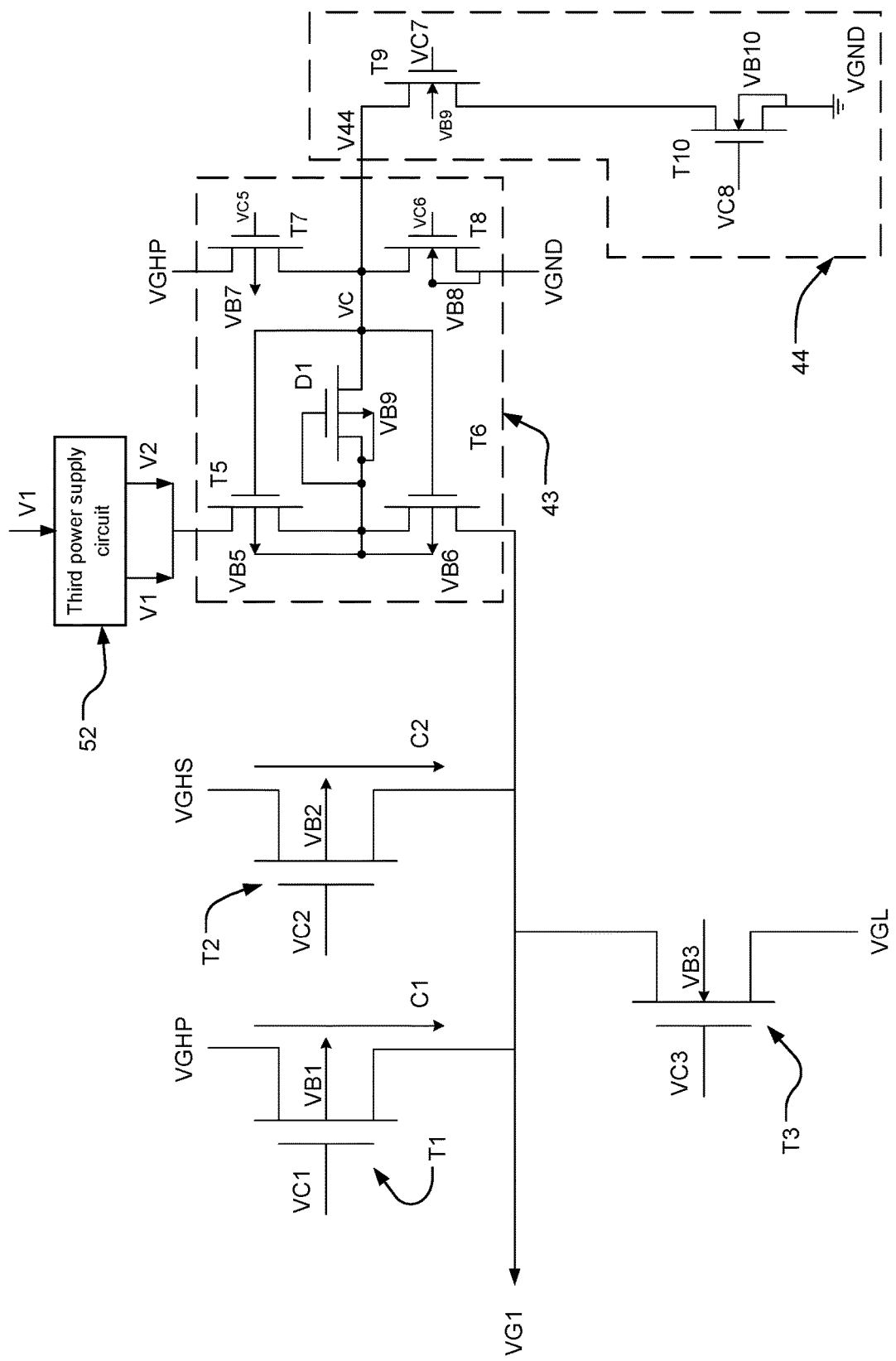
FIG. 5 shows a circuit diagram of the driver according to a third embodiment of the present invention.

Please refer to FIG. 5, which shows a circuit diagram of the driver according to a third embodiment of the present invention. As shown in the figure, the precharge circuit 43 in the embodiment in FIG. 5 replaces the precharge circuit 42 in the embodiment in FIG. 4. The difference therebetween is that the precharge circuit 43 in FIG. 5 includes a plurality of transistors. The gate across the body of the plurality of transistors can tolerate medium voltages, while the source across the drain can tolerate high voltages. Thereby, the present invention can be applied to applications requiring tolerance of high voltages. The precharge circuit 42 in FIG. 4 includes one or more high voltage tolerant transistor T4. The precharge circuit 43 includes a plurality of transistors T5, T6, T7, T8, D1. The transistors T5, T6, D1, T7, T8 are a first switching device, a second switching device, a control device, a third switching device, and a fourth switching device of the precharge circuit 43. Thereby, the first switching device (T5) receives an input voltage (the first precharge voltage V1 or the second precharge voltage V2) and transmits the first precharge voltage V1 or the second precharge voltage V2. The second switching device (V6) is coupled between the first switching device and an output terminal of the precharge circuit 43 and transmits the first precharge voltage V1 or the second precharge voltage V2 to the output terminal of the precharge circuit 43. A body of the second switching device is coupled to a body of the first switching device. The control device (D1) is coupled to the body contacts of the first switching device and the second switching device and to a control voltage VC. The control device controls a voltage level of the body contacts of the first switching device and the second switching device. The third switching device (T7) is coupled to the control device, receives a high voltage (according to the present, the first supply voltage VGHP), and transmits the first supply voltage VGHP, which is used as the control voltage VC, to the control device. The fourth switching device (T8) is coupled to the control device, receives a low voltage (according to the present embodiment, the reference voltage VGND), and transmits the reference voltage VGND, which is used as the control voltage VC, to the control device. Accordingly, under different circuit operations, the control voltage VC can be the first supply voltage VGHP or the reference voltage VGND.

The control terminal and the output terminal of the transistor D1 are connected to form a diode. The input terminal of the transistor D1 is a positive terminal while the output terminal of the transistor D1 is a negative terminal.

An input terminal of the transistor T7 is coupled to the first supply voltage VGHP. A control terminal of the transistor T7 is coupled to the control circuit 60 to generate a control signal VC5. An output terminal of the transistor T7 is coupled to an input terminal of the transistor D1. A body of the transistor T7 is coupled to a body voltage VB7. An output terminal of the transistor T8 is coupled to the output terminal of the transistor T7 and the input terminal of the transistor D1. A control terminal of the transistor T8 is coupled to the control signal VC6 of the control circuit 60. An input terminal of the transistor T8 is coupled to a reference voltage VGND. A body of the transistor T8 is coupled to a body voltage VB8. Besides, the body of the transistor T8 is coupled to the input terminal of the transistor T8. Thereby, the body of the transistor T8 and the input terminal of the transistor T8 are both at the voltage level of the reference voltage VGND.

Accordingly, when the control signal VC5 controls the transistor T7 to turn on, the input terminal of the transistor D1 is at the voltage level of the first supply voltage VGHP. On the other hand, when the control signal VC5 controls the transistor T7 to cut off and the control signal VC6 controls the transistor T8 to turn on, the input terminal of the transistor D1 is at the voltage level of the reference voltage VGND.

Please refer again to Figure. An input terminal of the transistor T5 is coupled to the precharge voltages V1, V5 of the third power supply circuit. A control terminal of the transistor T5 is coupled to the input terminal of the transistor D1. An output terminal of the transistor T5 is coupled to an output terminal of the transistor D1. An input terminal of the transistor T6 is coupled to the output terminal of the transistor T5 and the output terminal of the transistor D1. A control terminal of the transistor T6 is coupled to the input terminal of the transistor D1. An output terminal of the transistor T6 is coupled to the output terminal of the driver 41. A control terminal of the transistor D1 is coupled to the output terminal of the transistor D1. In addition, the bodies of the transistors D1, T5, T6 are mutually coupled to the same body voltage. Thereby, the body voltages VB5, VB6, VB9 are the same voltage level.

Accordingly, when the input terminal of the transistor D1 is at the voltage level of the first supply voltage VGHP, the voltage levels of the body voltages VB5, VB6, VB9, the control terminal of the transistor T5, and the control terminal of the transistor T6 approximate to the voltage level of the first supply voltage VGHP. Thereby, the transistors T5, T6 approximate to the cutoff state, and the precharge circuit 43 does not supply power to the output terminal of the driver 41. Besides, when the input terminal of the transistor D1 is at the voltage level of the reference voltage VGND, the transistors T5, T6 are in the turn-on state. Hence, the precharge circuit 43 transmits the first precharge voltage V1 or the second precharge voltage V2 to the output terminal of the driver 41 and controls the gate signal VG1 to rise to the first precharge voltage level or the second precharge voltage level.

Furthermore, the first precharge voltage level is lower than the second precharge voltage level; the second precharge voltage level is lower than the predetermined voltage level. Thereby, after the precharge circuit 43 of the driver 41 rises the voltage level of the gate signal VG1 according to the first precharge voltage V1 or the second precharge voltage V2, the precharge circuit 43 will be shut off. Then the driver 41 rises the voltage level of the gate signal VG1 to the predetermined voltage level according to the first supply voltage VGHP. By pre-rising the voltage level of the gate signal VG1 using the precharge circuit 43, the electrical energy can be saved. In addition, regarding controlling the turn-on and cutoff, the voltage level of the gate signal VG1 can be risen from the cutoff voltage level and lowered from the turn-on voltage level. In general, to guarantee the cutoff state of the pixel transistor 23, the voltage level of the cutoff voltage (the third supply voltage VGL) can be lower than the level of the reference voltage VGND. The level of the reference voltage VGND can be a ground level with zero voltage. Thereby, the cutoff voltage can be a negative voltage.

Please refer again to FIG. 5. The driving circuit for display panel can include a pull-down circuit 44, which is coupled to the control device and outputs a pull-down voltage V44 to the control device as the control voltage VC. A voltage level of the pull-down voltage V44 is reduced as time proceeds. Likewise, the transistor T3 can also pull down the voltage of the gate signal VG1. Thereby, in addition to a plurality of transistors T9, T10, the pull-down circuit 44 can include the transistor T3 as well. An output terminal of the transistor T9 is coupled to the input terminal of the transistor D1 of the precharge circuit 43. A control terminal of the transistor T9 is coupled to a control signal VC7 of the control circuit 60. An input terminal of the transistor T9 is coupled to an output terminal of the transistor T10. A control terminal of the transistor T10 is coupled to a control signal VC8 of the control circuit 60. An input terminal of the transistor T10 is coupled to a ground and a body of the transistor T10. Thereby, the input terminal and the body of the transistor T10 are both connected to the ground, namely, a body bias VB10 of the transistor T10 is the voltage level of the ground. Besides, the transistor T10 can be current source with different current values according to designs. The current value determines the falling rate of the pull-down voltage V44.

Moreover, to save power, the voltage level of the gate signal VG1 is held at the turn-on voltage. Before lowering the voltage level of the gate signal VG1 to the cutoff voltage level, the pull-down circuit 44 can control the transistors T5, T6 of the precharge circuit 43 to turn on and thus controlling the voltage level of the gate signal VG1 to fall to the first precharge voltage V1 or the second precharge voltage V2. Accordingly, the transistors T5, T6 of the precharge circuit 43 are equivalent to the pull-down circuit.

Because the bias across the gate and the body of the transistor T6 of the precharge circuit 43 can tolerate up to medium voltages, to avoid high voltage on the transistor T6, such as the high voltage difference between the reference voltage VGND and the second supply voltage VGHS on the transistor T6 (namely, the voltage difference between the control terminal and the output terminal), the pull-down circuit 44 controls the lowering of the voltage level of the control terminal of the transistor T6 to be stepwise, instead of lowering to the level of the reference voltage VGND directly. Thereby, the pull-down circuit 44 can control the voltage across the output terminal and the control terminal of the transistor T6 (the voltage difference between the voltage level of the gate signal VG1 and the pull-down voltage V44) will not exceed the tolerable voltage. By avoiding high voltages, breakdown is guaranteed not to occur in the switching device of the precharge circuit 43. Afterwards, the precharge circuit 43 will be shut off. Then the voltage level of the gate signal VG1 will fall to the cutoff voltage level due to the turning on of the transistor T3 and is still in the medium voltage range tolerable by the transistor T6.

Please refer to FIG. 1. The comparator 70 may not be set for the embodiment in FIG. 1 instead setting a timer, which can be disposed outside or inside the control circuit 60 and not limited by the embodiment. The timer sets a predetermined time according to the time required for the first supply voltage VGHP rising the voltage level of the gate signal VG1 over the predetermined voltage level. When the time exceeds the predetermined time, a timing signal is generated. According to the timing signal, the control circuit 60 can control the plurality of drivers 41 to hold the voltage levels of the plurality of gate signals VG1 according to the second supply voltage VGHS. According to the above description, the control circuit 60 controls the plurality of drivers 41 to rise the voltage levels of the plurality of gate signals VG1 according to the first supply voltage VGHP and starts timing. As the timing time reached the predetermined time, the control circuit 60 controls the plurality of drivers 41 to hold the voltage levels of the plurality of gate signals VG1 according to the second supply voltage VGHS.

Figure 6:
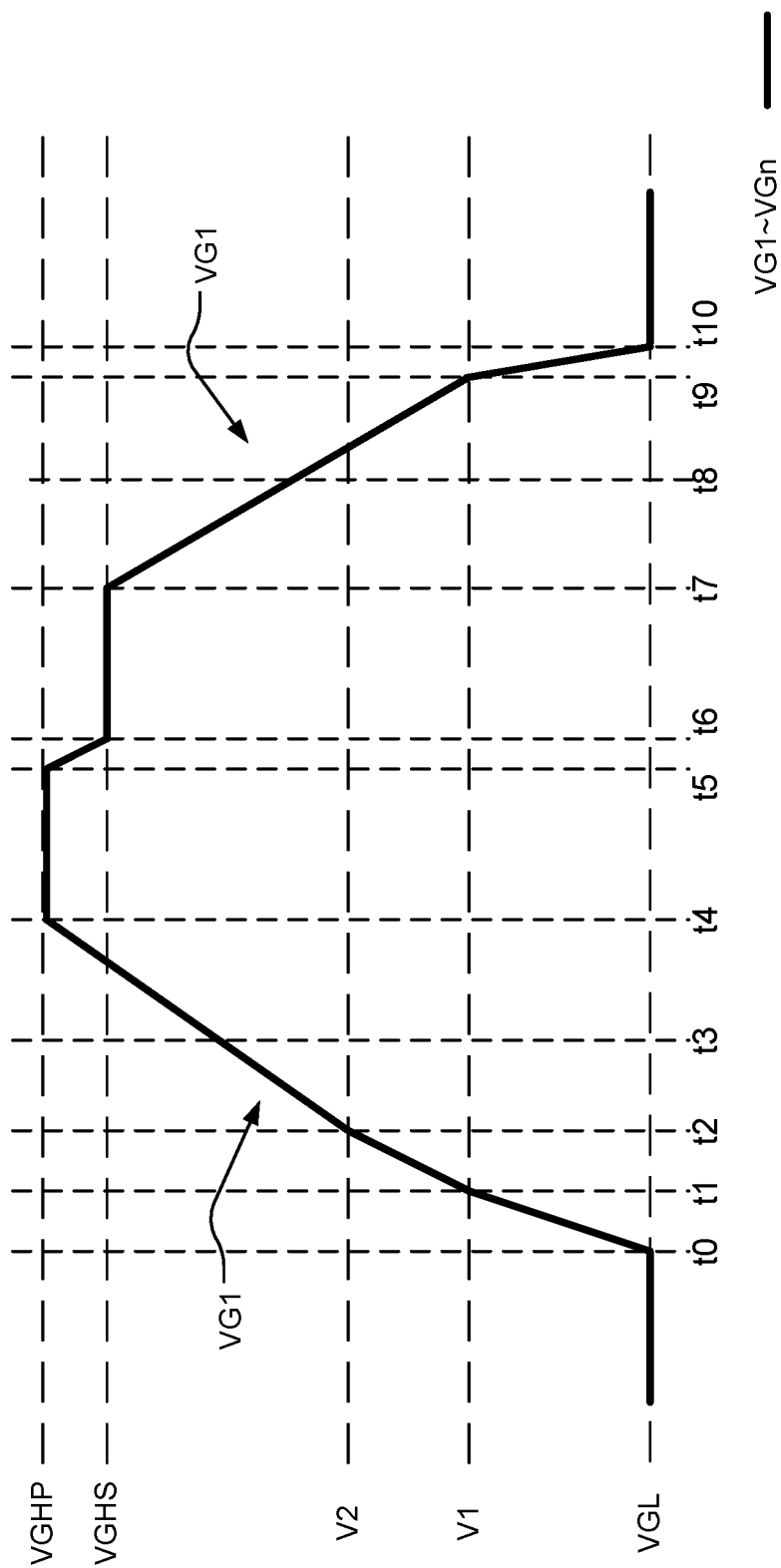
FIG. 6 shows a waveform of the gate signal with rising and falling voltage levels according to an embodiment of the present invention.

Please refer to FIG. 6, which shows a waveform of the gate signal with rising and falling voltage levels according to an embodiment of the present invention. As shown in the figure, the gate signal VG1 is at the cutoff voltage level (namely, VGL) before a time t0. It is only used for describing the initial voltage level of the gate signal VG1, not for limiting the initial voltage level of the gate signal VG1 to the cutoff voltage level. At a time t1, the gate signal VG1 is risen from the initial voltage level to the first precharge voltage level of the first precharge voltage V1 owing to the charging of the precharge circuit 43. At a time t2, the gate signal VG1 is further risen to the second precharge voltage level of the second precharge voltage V2 from the first precharge voltage level of the first precharge voltage V1. Alternatively, the gate signal VG1 can be charged directly to the second precharge voltage level of the second precharge voltage V2, instead of charging to the first precharge voltage level of the first precharge voltage V1 first.

Moreover, after the precharge circuit 43 stops supplying power, at a time t3 and a time t4, the driver 41 uses the power of the first power supply circuit 50 to rise the voltage level of the gate signal VG1 to the voltage level of the first supply voltage VGHP. Preferably, the voltage level of the first supply voltage VGHP is higher than the voltage level of the second supply voltage VGHS. Thereby, the period between the time t0 and a time t5 is the voltage rising period rising of the gate signal VG1. In the voltage holding period holding, namely, between a time t6 and a time t7, the driver 41 uses the power of the second power supply circuit 51 to hold the voltage level of the gate signal VG1 at the voltage level of the second supply voltage VGHS, which is just the turn-on voltage level.

The period from a time t7 to a time t10, passing a time t8, and a time t9, is like the precharge period used for saving power. Thereby, the voltage level of the gate signal VG1 is first lowered from the turn-on voltage level to a pull-down voltage level, which is just the first precharge voltage level of the first precharge voltage V1 according to the present embodiment. Alternatively, the voltage level of the gate signal VG1 can first fall to the pull-down voltage level (in this case, the level of the second precharge voltage V2) and then to the first precharge voltage level of the first precharge voltage V1. Finally, the transistor T3 controls the voltage level of the gate signal VG1 to fall to the cutoff voltage level.

To sum up, the present invention discloses a driving circuit for display panel, which comprises a first power supply circuit, a second power supply circuit, and a plurality of drivers. The first power supply circuit and the second power supply circuit produce a first supply voltage and a second supply voltage, respectively. The electric charge provided by the second power supply circuit is less than the electric charge provided by the first power supply circuit.

The plurality of drivers generates a plurality of gate signals and includes a plurality of first power inputs and a plurality of second power inputs. The plurality of first power inputs are coupled to the first power supply circuit and receives the first supply voltage. The plurality of second power inputs are coupled to the second power supply circuit and receives the second supply voltage. The plurality of drivers increase the voltage levels of the plurality of gate signals, respectively, in a voltage rising period according to the first supply voltage. The plurality of drivers hold the voltage levels of the plurality of gate signals, respectively, in a voltage holding period according to the second supply voltage.

The invention claimed is:

1. A driving circuit for display panel, comprising:
   a first power supply circuit, producing a first supply voltage;
   a second power supply circuit, producing a second supply voltage, and the electric charge provided by said second power supply circuit is lower than the electric charge provided by the first power supply circuit; and
   a plurality of drivers, generating a plurality of gate signals, said plurality of drivers including a plurality of first power supply input terminals and a plurality of second power supply input terminals, said plurality of first power supply input terminals coupled to said first power supply circuit for receiving said first supply voltage, said plurality of second power supply input terminals coupled to said second power supply circuit for receiving said second supply voltage, said plurality of drivers rising a voltage level of said plurality of gate signals, respectively, in a voltage rising period according to said first supply voltage, and said plurality of drivers holding said voltage level of said plurality of gate signals, respectively, in a voltage holding period according to said second supply voltage;
   wherein said voltage level of said plurality of gate signals are risen to a predetermined voltage level in said voltage rising period according to said first supply voltage, and said voltage level of said plurality of gate signals are held at a turn-on voltage level in said voltage holding period according to said second supply voltage.

2. The driving circuit for display panel of claim 1, wherein said plurality of drivers rises said voltage level of said plurality of gate signals to said predetermined voltage level according to said first supply voltage and said predetermined voltage level is higher than or equal to said turn-on voltage level.

3. The driving circuit for display panel of claim 1, wherein said plurality of drivers hold said voltage level of said plurality of gate signals at said turn-on voltage level according to said second supply voltage.

4. The driving circuit for display panel of claim 1, wherein said plurality of drivers control said voltage level of said plurality of gate signals to be lowered from said turn-on voltage level to a cutoff voltage level according to a third supply voltage.

5. The driving circuit for display panel of claim 1, wherein said plurality of drivers include, respectively, a precharge circuit, rising said voltage level of said plurality of gate signals to a first precharge voltage level according to a first precharge voltage, and said first precharge voltage level is lower than said predetermined voltage level.

6. The driving circuit for display panel of claim 5, wherein said precharge circuit is coupled between a third power supply circuit and an output terminal of said driver, and said third power supply circuit provides said first precharge voltage.

7. The driving circuit for display panel of claim 5, wherein said precharge circuit is coupled to a first power supply circuit, and said first power supply circuit provides said first precharge voltage.

8. The driving circuit for display panel of claim 5, wherein said precharge circuit controls said voltage level of said plurality of gate signals to be risen from said first precharge voltage level to a second precharge voltage level according to a second precharge voltage, and said second precharge voltage level is lower than said predetermined voltage level.

9. The driving circuit for display panel of claim 8, wherein said precharge circuit is coupled between a third power supply circuit and an output terminal of said driver, and said third power supply circuit provides said first precharge voltage and said second precharge voltage.

10. The driving circuit for display panel of claim 8, wherein said precharge circuit is coupled to said first power supply circuit, and said first power supply circuit provides said first precharge voltage and said second precharge voltage.

11. The driving circuit for display panel of claim 8, wherein said precharge circuit includes:
    a first switching device, receiving said first precharge voltage or said second precharge voltage, and transmitting said first precharge voltage or said second precharge voltage;
    a second switching device, coupled between said first switching device and an output terminal of said precharge circuit, transmitting said first precharge voltage or said second precharge voltage to said output terminal, and a body of said second switching device coupled to a body of said first switching device; and
    a control device, coupled to a body contact of said first switching device and said second switching device and to a control voltage, and controlling a voltage level of said body contact of said first switching device and said second switching device according to said control voltage.

12. The driving circuit for display panel of claim 11, wherein said precharge circuit further includes:
    a third switching device, coupled to said control device, said first switching device, and said second switching device, receiving said first supply voltage, transmitting said first supply voltage to said control device as said control voltage, and said first supply voltage controlling said first switching device and said second switching device; and
    a fourth switching device, coupled to said control device, said first switching device, and said second switching device, receiving a reference voltage, transmitting said reference voltage to said control device as said control voltage, and said reference voltage controlling said first switching device and said second switching device.

13. The driving circuit for display panel of claim 11, and further comprising a pull-down circuit, coupled to said control device, said first switching device and said second switching device, and outputting a pull-down voltage to said control device as said control voltage, said pull-down voltage controlling said first switching device and said second switching device, and a voltage level of said pull-down voltage falling as time proceeds.

14. The driving circuit for display panel of claim 1, and further comprising:

a comparison circuit, coupled to a baseline voltage and said gate signal, and generating a compare signal according to said baseline voltage and said gate signal; and a control circuit, coupled to said comparison circuit and said plurality of drivers, and controlling said plurality of drivers according to said compare signal to control said voltage level of said plurality gate signals according to said first supply voltage or said second supply voltage.

15. The driving circuit for display panel of claim 1, and further comprising a control circuit, coupled to said plurality of drivers, controlling said plurality of drivers to rise said voltage level of said plurality of gate signals according to said first supply voltage, performing timing, and controlling said plurality of drivers to hold said voltage level of said plurality of gate signals according to said second supply voltage when the time exceeds the predetermined time.

16. The driving circuit for display panel of claim 1, wherein said plurality of drivers further comprises, respectively, a pull-down circuit, coupled to an output terminal of said driver, and controlling said voltage level of said gate signal to be lowered to a cutoff voltage level.

17. The driving circuit for display panel of claim 16, wherein after said plurality of pull-down circuits control said voltage level of said plurality of gate signals to be lowered to a pull-down voltage level, said plurality of pull-down circuits further control said voltage level of said plurality of gate signals to be lowered to said cutoff voltage.

18. A high voltage tolerant circuit for driving circuit, comprising:
a first switching device, receiving an input voltage, and transmitting said input voltage;

a second switching device, coupled between said first switching device and an output terminal, transmitting said input voltage to said output terminal, and a body of said second switching device is coupled to a body of said first switching device; and a control device, coupled to a body contact of said first switching device and said second switching device and to a control voltage, and controlling a voltage level of said body contact of said first switching device and said second switching device according to said control voltage.

19. The high voltage tolerant circuit for driving circuit of claim 18, and further comprising:
a third switching device, coupled to said control device, receiving a high voltage, and transmitting said high voltage to said control device as said control voltage; and a fourth switching device, coupled to said control device, receiving a low voltage, transmitting said low voltage to said control device as said control voltage, and said low voltage smaller than said high voltage.

20. The high voltage tolerant circuit for driving circuit of claim 18, and further comprising a pull-down circuit, coupled to said control device, and outputting a pull-down voltage to said control device as said control voltage, and a voltage level of said pull-down voltage falling as time proceeds.

21. The high voltage tolerant circuit for driving circuit of claim 18, wherein said first switching device and said second switching device are transistors, respectively, and said control device is a diode.

* * * * *